United States Patent
Fukushima et al.

(10) Patent No.: US 7,307,023 B2
(45) Date of Patent: Dec. 11, 2007

(54) POLISHING METHOD OF CU FILM AND METHOD FOR MANUFACTURING SEMICONDUCTOR DEVICE

(75) Inventors: Dai Fukushima, Kamakura (JP); Gaku Minamihaba, Yokohama (JP); Hiroyuki Yano, Yokohama (JP); Susumu Yamamoto, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/540,707

(22) Filed: Oct. 2, 2006

(65) Prior Publication Data

US 2007/0093064 A1    Apr. 26, 2007

(30) Foreign Application Priority Data

Oct. 20, 2005    (JP)    ............................. 2005-305577

(51) Int. Cl.
    *H01L 21/302* (2006.01)
(52) U.S. Cl. ...................... 438/692; 438/693; 438/700; 216/89; 216/90
(58) Field of Classification Search ................ 438/692, 438/693, 700; 216/89, 90
    See application file for complete search history.

(56) References Cited

U.S. PATENT DOCUMENTS

| | | | |
|---|---|---|---|
| 6,059,920 A | 5/2000 | Nojo et al. | |
| 6,776,696 B2 | 8/2004 | Mahulikar et al. | |
| 2004/0152316 A1* | 8/2004 | Ono et al. | 438/689 |
| 2004/0237413 A1 | 12/2004 | Shida et al. | |
| 2005/0176250 A1* | 8/2005 | Takahashi et al. | 438/691 |
| 2005/0205520 A1* | 9/2005 | Tsai | 216/86 |
| 2005/0266688 A1* | 12/2005 | Watanabe | 438/692 |

FOREIGN PATENT DOCUMENTS

| | | |
|---|---|---|
| JP | 09-285968 | 11/1997 |
| JP | 2004-363574 | 12/2004 |

* cited by examiner

*Primary Examiner*—Binh X. Tran
(74) *Attorney, Agent, or Firm*—Finnegan, Henderson, Farabow, Garrett & Dunner, L.L.P.

(57) ABSTRACT

A method for polishing a Cu film comprises contacting a Cu film formed above a semiconductor substrate with a polishing pad attached to a turntable, and supplying a first chemical liquid which promotes the polishing of the Cu film and a second chemical liquid which contains a surfactant, to the polishing pad while the turntable being rotated, thereby polishing the Cu film, while monitoring at least one of a table current of the turntable and a surface temperature of the polishing pad to detect a change in at least one of the table current of the turntable and the surface temperature of the polishing pad. The supply of the second chemical liquid is controlled in conformity with the change.

20 Claims, 4 Drawing Sheets

POLISHING METHOD OF CU FILM AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2005-305577, filed Oct. 20, 2005, the entire contents of which are incorporated herein by reference.

BACKGROUND OF THE INVENTION

1. Field of the Invention

This invention relates to a method of polishing a Cu film and to a method for manufacturing a semiconductor device.

2. Description of the Related Art

In the actual use of a Cu wiring, the polishing of the Cu film (a first metal polishing) is required to be performed in such a manner that the polishing rate of Cu film should be 1000 nm/min or more and that the polishing is stopped at a barrier metal with the dishing of Cu film being suppressed to 20 nm or less. Furthermore, the polishing of the barrier metal (a second metal polishing) to be performed subsequent to the first metal polishing is required to be performed in such a manner that the dishing of the Cu film, as well as the erosion of the insulating film should be suppressed to 20 nm or less in the step of exposing the surface of the insulating film.

In the case of a high-performance LSI of the next generation in particular, since a Low-k insulating film is employed in order to alleviate RC delay, it is required to take into account the peeling of the film or the fracture of the film itself. In view of these problems, it is required to perform the polishing at low friction and with high stability (preferably, without any substantial rise in temperature). However, it is difficult to realize such an ideal polishing using the conventional one-pack supply type slurry and the conventional apparatus.

With a view to prevent the stagnation of a polishing solution to be employed in the polishing and to prevent the flocculation or precipitation of abrasive grains, there has been proposed a two-pack supply type slurry. Further, with a view to prevent not only the enlargement of dishing but also the erosion of wirings, there has been proposed a two-pack supply type slurry which further comprises the supply of a surfactant.

BRIEF SUMMARY OF THE INVENTION

A method for polishing a Cu film according to one aspect of the present invention comprises contacting a Cu film formed above a semiconductor substrate with a polishing pad attached to a turntable; and supplying a first chemical liquid which promotes the polishing of the Cu film and a second chemical liquid which contains a surfactant, to the polishing pad while the turntable being rotated, thereby polishing the Cu film, while monitoring at least one of a table current of the turntable and a surface temperature of the polishing pad to detect a change in at least one of the table current of the turntable and the surface temperature of the polishing pad, the supply of the second chemical liquid being controlled in conformity with the change.

A method for manufacturing a semiconductor device according to another aspect of the present invention comprises forming an insulating film above a semiconductor substrate; forming a recess in the insulating film; forming a Cu film, through a barrier metal, in the recess and above the insulating film; and removing the Cu film above the insulating film to selectively leave the Cu film in the recess, thereby forming a buried wiring; the removal of the Cu film formed above the insulating film being performed by contacting the Cu film with a polishing pad attached to a turntable; supplying a first chemical liquid which promotes the polishing of the Cu film and a second chemical liquid which contains a surfactant, to the polishing pad while the turntable being rotated, thereby polishing the Cu film, while monitoring at least one of a table current of the turntable and a surface temperature of the polishing pad to detect a change in at least one of the table current of the turntable and the surface temperature of the polishing pad, the supply of the second chemical liquid being controlled in conformity with the change.

DETAILED DESCRIPTION OF THE INVENTION

Next, embodiment of the present invention will be explained with reference to drawings.

Figure 1:
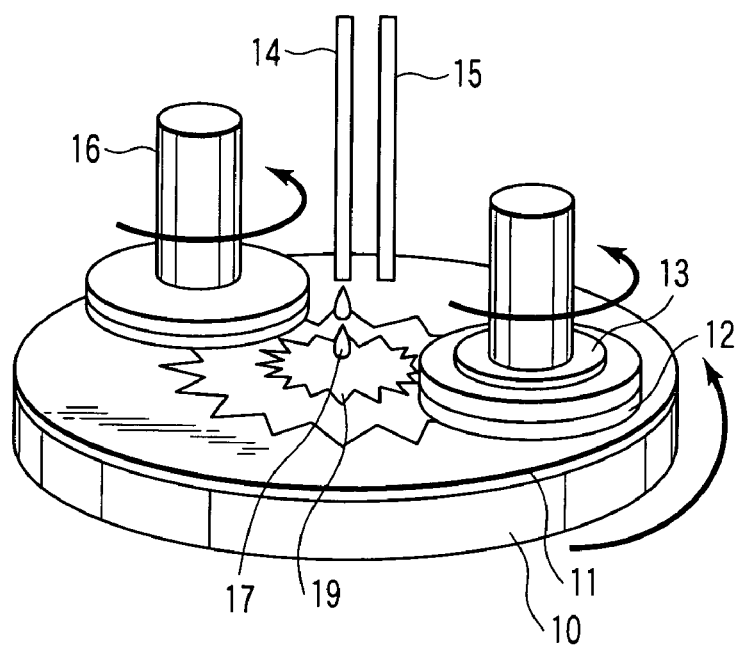
FIG. 1 is a schematic diagram illustrating a state in the polishing process in the manufacturing method of a semiconductor device according to one embodiment of the present invention.

FIG. 1 is a schematic diagram illustrating a state in the polishing of a Cu film according to one embodiment of the present invention.

For example, under the condition where a turntable 10 having a polishing pad 11 attached thereto is rotating as shown in FIG. 1, a top ring 13 holding a semiconductor substrate 12 having a Cu film (not shown) formed thereon is contacted with the polishing pad 11. The rotational speed of the turntable 10 may be within the range of 30 to 150 rpm for instance. The rotational speed of the top ring 13 is generally within the range of about 30 to 150 rpm. The polishing load in this polishing step is generally within the range of about 50 to 70 gf/cm$^2$.

A first chemical liquid 17 which promotes the polishing of the Cu film is supplied from a first supply port 14 to the polishing pad 11 to perform the polishing of the Cu film (not shown) formed on the semiconductor substrate 12 while monitoring the table current of the turntable 10 or the surface temperature of the polishing pad 11. The first chemical liquid 17 is formed of a composition of base slurry, which is employed singly at this stage as a slurry 19. With respect to the monitoring of the table current, etc., it will be discussed in detail hereinafter. In the method according to the embodiment, the polishing of the Cu film is performed while controlling the supply of the second chemical liquid from the second supply port 15 in conformity with changes of the values that have been monitored. Incidentally, FIG. 1 also shows a dresser 16.

The first chemical liquid to be supplied from the first supply port 14 comprises water, an oxidizing agent and an organic acid. As the oxidizing agent, it is possible to employ, for example, ammonium persulfate, potassium persulfate, aqueous solution of hydrogen peroxide, ferric nitrate, iron sulfate, potassium iodate, silicomolybdic acid, etc. As the organic acid, it is possible to employ, for example, maleic acid, oxalic acid, citric acid, malic acid, malonic acid, succinic acid, phthalic acid, quinaldinic acid, quinolinic acid, benzotriazole, alanine, glycine, etc.

The pH of the first chemical liquid containing an oxidizing agent and an organic acid as described above should preferably be adjusted to fall within the range of about 8 to 14 (for example, pH=12 or so) using a pH adjustor.

As the first chemical liquid is applied to the polishing pad being contacted with the Cu film, the surface of the Cu film is oxidized to create an oxidized film. Since this oxidized film can be more easily removed as compared with the Cu film, the polishing of the Cu film can be promoted. Namely, the polishing of the Cu film is proceeded through the mechanical scraping of this oxide film as it is polished by the polishing pad.

If required, the first chemical liquid may contain abrasive grains and a surfactant. As the abrasive grains, it is possible to employ colloidal silica, fumed silica, colloidal alumina, fumed alumina, ceria, titania, organic particles, and composite particles formed of an integral body consisting of inorganic particle and organic particle. Since these particles mechanically remove the oxidized film created on the surface of Cu film, the polishing of the Cu film can be further promoted while concurrently proceeding the polishing by the first chemical liquid. Accordingly, the polishing time of the Cu film can be substantially shortened. Almost the same effects as described above can be obtained by using so-called fixed abrasive grains where the abrasive grains are embedded on the surface of a polishing pad.

As the surfactant to be included in the first chemical liquid, it is possible to employ, for example, alkylbenzene sulfonate such as potassium dodecylbenzene sulfonate and ammonium dodecylbenzene sulfonate; poly(vinyl pyrrolidone); and acetylene glycol-based surfactant.

All of these surfactants would not degrade the dishing of the Cu film. More specifically, alkylbenzene sulfonate and poly(vinyl pyrrolidone) are both effective in suppressing the dishing of the Cu film, while acetylene glycol is effective not only in further enhancing the corrosion resistance but also in maintaining the dishing of the Cu film. The expression of "maintaining the dishing" means that the dishing cannot be enlarged by the employment of this surfactant and it is not restrict to positively decreasing the dishing. For example, when a slurry containing no surfactant is employed in the polishing of the Cu film, dishing is more or less generated on the surface of the Cu film, and even when a slurry containing this surfactant is employed in the polishing of the Cu film, the dishing generates on the surface of the Cu film to the same extent as the first-mentioned polishing. Since these surfactants are incapable of degrading the dishing of the Cu film, they can be incorporated in the second chemical liquid described below. The aforementioned alkylbenzene sulfonate and acetylene glycol are also effective in raising the table current and the surface temperature of the polishing pad, while the aforementioned poly(vinyl pyrrolidone) is effective in lowering the table current and the surface temperature of the polishing pad.

Figure 2:
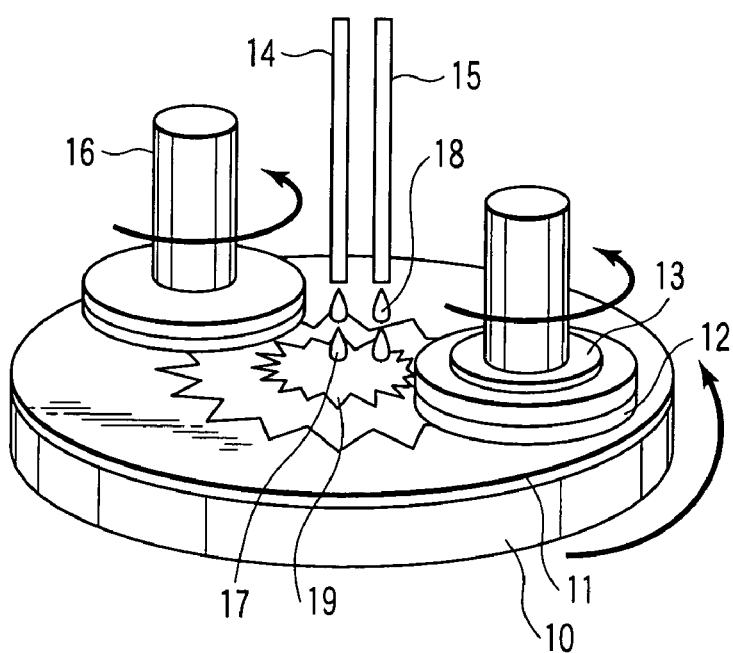
FIG. 2 is a schematic diagram illustrating another state in the polishing process in the manufacturing method of a semiconductor device according to one embodiment of the present invention.

Usually, the surface of the Cu film before polishing is accompanied with projected/recessed portions, so that the area of the Cu film that can be contacted with the polishing pad is relatively small. Therefore, the magnitude of abrasive friction is small and the surface temperature of the polishing pad is also low. Likewise, the table current is small in the initial stage of polishing. As the polishing of the Cu film using the first chemical liquid is advanced, the surface of the Cu film is planarized to increase the contacting area thereof with the polishing pad, thereby raising the table current or the surface temperature of the polishing pad. Although there is an optimal range not only in the table current but also in the surface temperature of the polishing pad in order to realize a desired polishing, the table current as well as the surface temperature of the polishing pad rise exceeding beyond the optimal range in the progress of polishing. In this case, a second chemical liquid 18 is supplied to the polishing pad from a second supply port 15 as shown in FIG. 2 and mixed with the first chemical liquid 17 to form a mixture, which is employed as a slurry 19 for continuing the polishing of the Cu film.

This second chemical liquid 18 comprises, as a surfactant, poly(vinyl pyrrolidone), in this case. Since this poly(vinyl pyrrolidone) lowers the table current or the surface temperature of the polishing pad, the supply flow rate of the second chemical liquid 18 containing poly(vinyl pyrrolidone) is considered as negatively correlated with the table current and/or the surface temperature of the polishing pad. An example of the poly(vinyl pyrrolidone) is available in the market as a product named PVP-K30 (ISP Japan Co., Ltd.) having a molecular weight of 40,000.

The concentration of the surfactant in the second chemical liquid 18 should preferably be within the range of 0.1 to 2 wt %. If the concentration of the surfactant is less than 0.1 wt %, it may become difficult to enable the surfactant to sufficiently exhibit the effects thereof. On the other hand, if the concentration of the surfactant exceeds 2 wt %, the composition of the base slurry for promoting the polishing of the Cu film would be considerably distorted, thus possibly degrading the polishing rate of the Cu film.

This second chemical liquid 18 should preferably be supplied at a low flow rate of 100 cc/min or less. If the flow rate of this second chemical liquid 18 exceeds 100 cc/min, the balance of components of the base slurry would be disordered, raising various problems such as the enlargement of dishing and corrosion. In order to derive the effects of the second chemical liquid 18, the lower limit of the flow rate of the second chemical liquid 18 should preferably be set to about 10 cc/min. In the embodiment shown in FIGS. 1 and 2, although the second supply port 15 is provided in a form of a nozzle which is disposed separately from that of the first supply port 14, the construction of the second supply port 15 may not be confined to such as shown in FIGS. 1 and 2. Namely, these first and second supply ports 14 and 15 may be constructed so as to communicate with each other at their distal end portions thereof, thereby making it possible to form a mixture consisting of these chemical liquids before they are delivered to the polishing pad 11. In this embodiment, a valve dedicated to the second chemical liquid 18 may be provided so as to make it possible to control the supply of the second chemical liquid 18. Alternatively, the second chemical liquid 18 may be sprayed, through a spray supply port, to the polishing pad 11. When the second chemical liquid 18 is sprayed in this manner, the in-plane uniformity of the treating surface can be further enhanced after finishing the polishing step.

As the second chemical liquid 18 is supplied to the polishing pad 11 in this manner, the table current and the surface temperature of the polishing pad will be lowered. Namely, the table current or the surface temperature of the polishing pad that has been changed will be reversed to an appropriate range. During the time when the second chemical liquid 18 is being supplied to the polishing pad, the monitoring of the table current or the surface temperature of the polishing pad is continued, thus making it possible to repeatedly control the supply of the second chemical liquid 18 in conformity with the change of the table current or the surface temperature of the polishing pad. As the supply of the second chemical liquid 18 is controlled, i.e. the flow rate thereof is reduced, the table current or the surface temperature of the polishing pad rises. Although the most convenient method of control in this case is to suspend the supply of the second chemical liquid 18, the control of the second chemical liquid 18 through adjusting the flow rate thereof is advantageous in that the table current or the surface temperature of the polishing pad can be maintained at nearly an optimal value.

Depending on the kinds of the surfactant to be included in the second chemical liquid 18, the first chemical liquid 17 and the second chemical liquid 18 may be concurrently supplied to the polishing pad 11 as shown in FIG. 2, thus enabling to perform the polishing of the Cu film using the slurry 19 which is a mixture of these chemical liquids 17 and 18. In this case, alkylbenzene sulfonate or acetylene glycol, for example, may be incorporated, as a surfactant, into the second chemical liquid 18. Since these surfactants act to raise the table current or the surface temperature of the polishing pad as mentioned above, the supply flow rate of the second chemical liquid 18 containing alkylbenzene sulfonate or acetylene glycol is considered as positively correlated with the table current and/or the surface temperature of the polishing pad. An example of the alkylbenzene sulfonate is potassium dodecylbenzene sulfonate (DBK) and the acetylene glycol is available in the market as a product named sarfinol 465 (Air Products Japan Co., Ltd.).

When the polishing of the Cu film is initiated while supplying the second chemical liquid 18 which contains any of these surfactants together with the supply of the first chemical liquid 17 which is a base slurry, the table current or the surface temperature of the polishing pad will rise acceleratingly. When the table current or the surface temperature of the polishing pad is excessively increased, the supply of the second chemical liquid 18 is controlled. More specifically, the control of the second chemical liquid 18 is performed by decreasing the flow rate of the second chemical liquid 18. When the flow rate of the second chemical liquid 18 is controlled in this manner, the table current or the surface temperature of the polishing pad will decrease. In this case also, the table current or the surface temperature of the polishing pad that has been changed will be reversed to an appropriate range. As described above, although most convenient method of control is to suspend the supply of the second chemical liquid 18 as shown in FIG. 1, the control of the second chemical liquid 18 through adjusting the flow rate thereof is advantageous in that the table current or the surface temperature of the polishing pad can be maintained at nearly an optimal value.

When reversing the change of the table current or the surface temperature of the polishing pad to an appropriate range by suspending the supply of the second chemical liquid, it is possible to employ a third chemical liquid containing a surfactant which exhibits the effect quite opposite to that of the second chemical liquid. The supply of this third chemical liquid can be controlled in association with the second chemical liquid. More specifically, as the supply of the second chemical liquid is suspended, the supply of the third chemical liquid is initiated, and, on the contrary, as the supply of the second chemical liquid is initiated, the supply of the third chemical liquid is suspended. The operation of the second chemical liquid and third chemical liquid may not be limited to the aforementioned style of supply/suspension, but may be such that the flow rate of the second chemical liquid and third chemical liquid is increased or decreased in proportion to each other to control the supply of the second chemical liquid and third chemical liquid. The combined use of the third chemical liquid is advantageous in that the action to reverse the change of the table current or the surface temperature of the polishing pad to an appropriate range can be enhanced, thus shorting the polishing time.

In any of the aforementioned embodiments, the monitoring of the table current or the surface temperature of the polishing pad is continued until the polishing of the Cu film is finished, in the course of which the supply of the second chemical liquid is controlled in conformity with the change of the table current or the surface temperature of the polishing pad.

Figure 3:
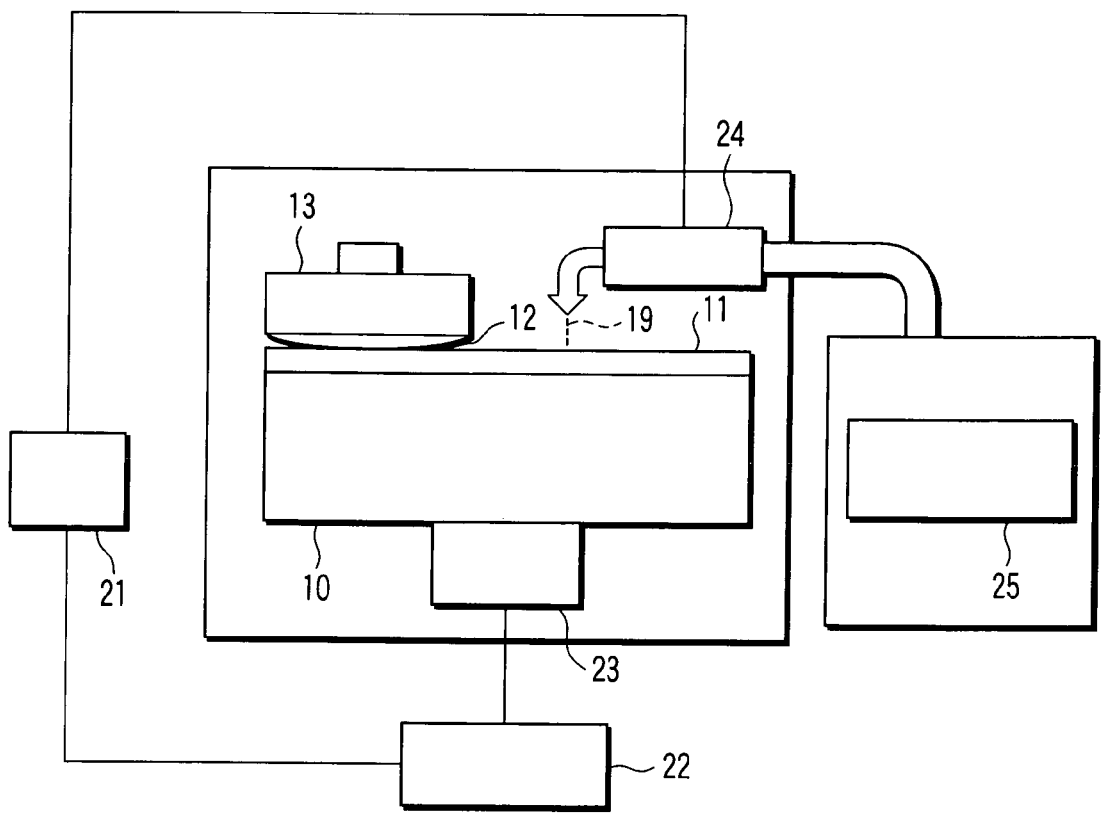
FIG. 3 is a diagram illustrating the construction of a polishing apparatus according to one embodiment of the present invention.

For carrying out the method according to one embodiment of the present invention, a polishing apparatus shown in FIG. 3, for example, can be employed. FIG. 3 is a diagram schematically illustrating, as one example, the construction of a polishing apparatus for carrying out the method of polishing a Cu film according to one embodiment of the present invention.

As shown in FIG. 3, the motor 23 for rotating the turntable 10 is connected with a table current monitor 22, and the measured value of the table current is transmitted to a controller 21. In this controller 21, using the measured value of the table current as a criterion, a signal for controlling the supply of the second chemical liquid is transmitted to a flow meter 24.

The flow meter 24 controls the supply of a slurry from a slurry feeder 25. This slurry feeder 25 is charged with the first chemical liquid and the second chemical liquid. The supply of the second chemical liquid among these chemical liquids is controlled based on the instruction transmitted from the controller 21.

When polishing the Cu film using the apparatus constructed as described above, it is also possible to monitor the surface temperature of the polishing pad. In this case, the surface temperature of the polishing pad is not required to be fed back for the supply of slurry.

Figure 4:
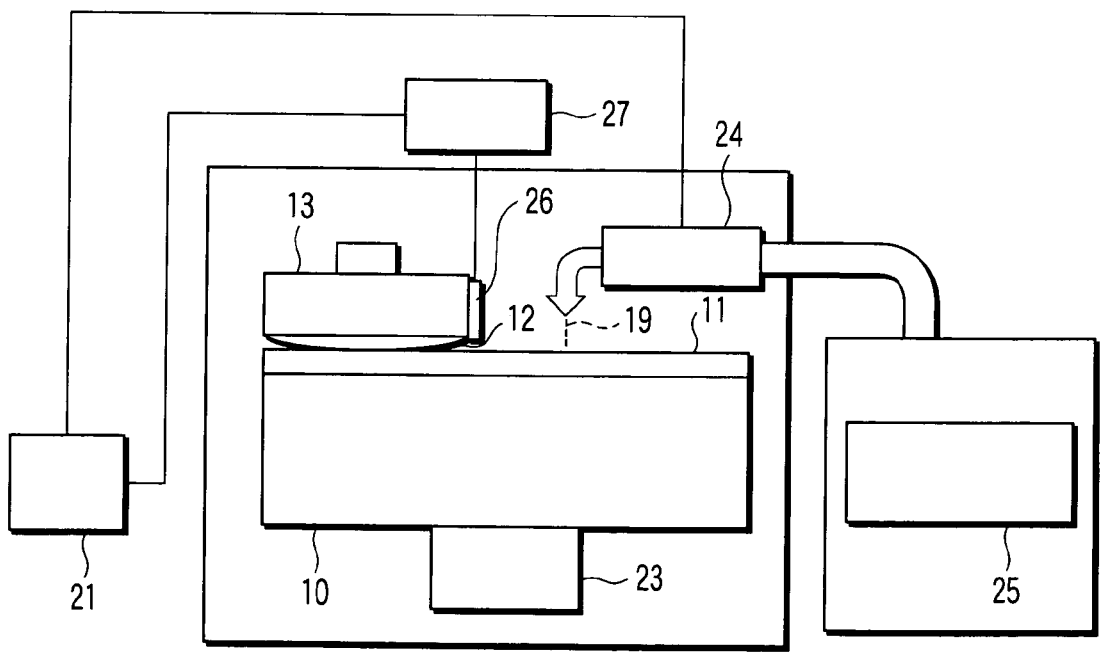
FIG. 4 is a diagram illustrating the construction of a polishing apparatus according to another embodiment of the present invention.

FIG. 4 shows, as another example, the construction of the polishing apparatus to be employed in one embodiment of the present invention.

As shown in FIG. 4, the top ring 13 is provided with a radiation thermometer 26 for measuring the surface temperature of the polishing pad 11, the surface temperature thus measured being transmitted via a temperature monitor 27 to the controller 21. In this controller 21, using the measured value of the surface temperature of the polishing pad 11 as a criterion, a signal for controlling the supply of the second chemical liquid is transmitted to the flow meter 24.

Incidentally, in addition to the surface temperature of the polishing pad, it is also possible to monitor the table current of turntable. In this case, the table current is not required to be fed back for the supply of slurry.

Next, embodiments of the present invention will be explained.

Embodiment 1

This embodiment will be explained with reference to FIGS. 5 and 6.

Figure 5:
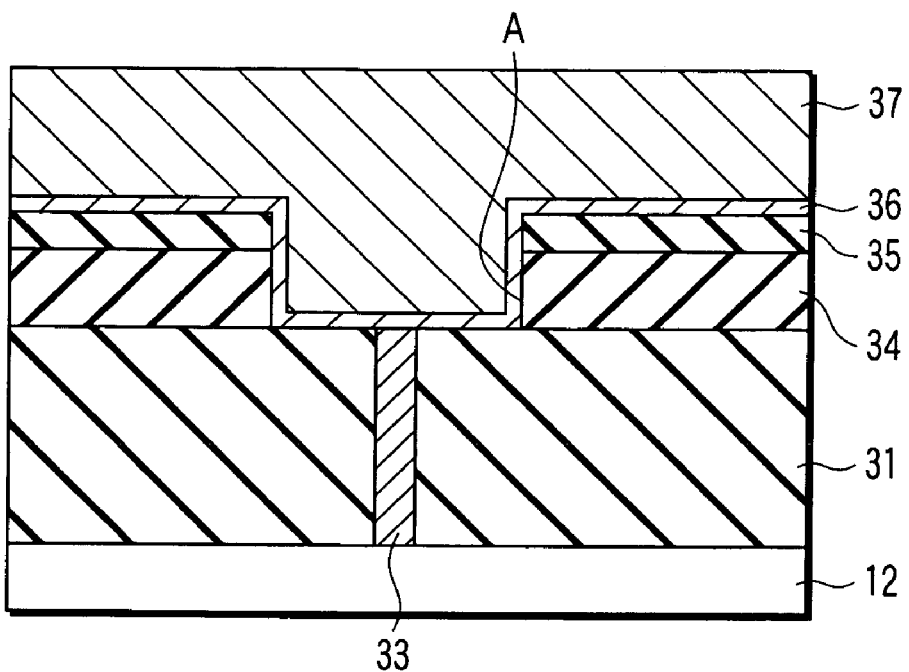
FIG. 5 is a cross-sectional view illustrating a step representing the method for manufacturing a semiconductor device according to a further embodiment of the present invention.
Figure 6:
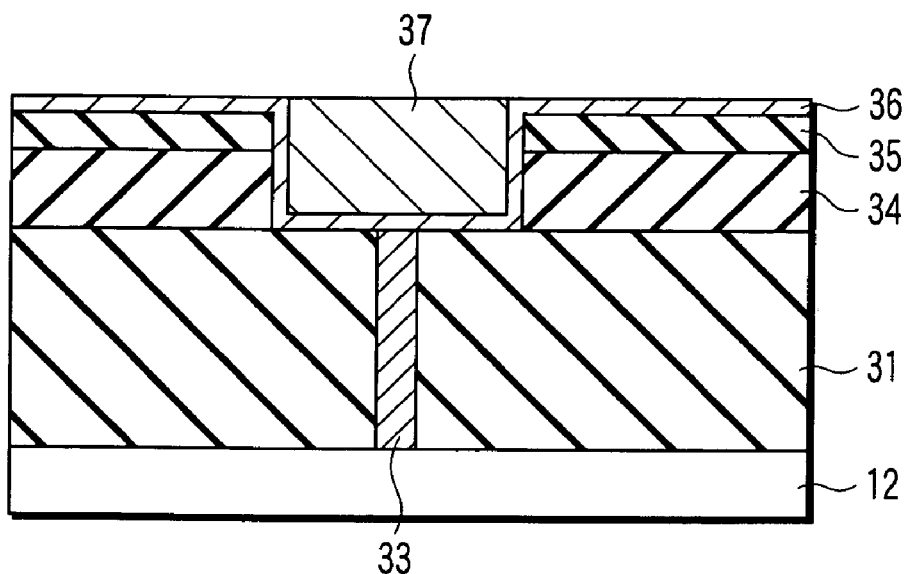
FIG. 6 is a cross-sectional view illustrating a step after the step shown in FIG. 5.

First of all, as shown in FIG. 5, an insulating film 31 made of $SiO_2$ is deposited on a semiconductor substrate 12 having semiconductor elements (not shown) formed therein. Then, a plug 33 made of W is formed in the insulating film 31. Then, a first low dielectric constant insulating film 34 and a second low dielectric constant insulating film 35 are successively formed on the insulating film 31 including the plug 33, thereby forming a laminated insulating film. The first low dielectric constant insulating film 34 can be formed by a low dielectric constant insulating material exhibiting a relative dielectric constant of less than 2.5. For example, this first low dielectric constant insulating film 34 may be formed of at least one selected from the group consisting a film having a siloxane skeleton such as polysiloxane, hydrogen silsesquioxane, polymethyl siloxane, methylsilsesquioxane, etc.; a film comprising, as a main component, an organic resin such as polyarylene ether, polybenzoxazole, polybenzocyclobutene, etc.; and a porous film such as a porous silica film. In this embodiment, the first low dielectric constant insulating film 34 was formed by LKD (available from JSR Co., Ltd.) so as to have a film thickness of 80 nm.

The second low dielectric constant insulating film 35 formed on the first low dielectric constant insulating film 34 functions as a cap insulating film and can be formed by an insulating material having a larger relative dielectric constant than that of the first low dielectric constant insulating film 34. For example, the second low dielectric constant insulating film 35 may be formed of at least one insulating material having a relative dielectric constant of 2.5 or more and selected from the group consisting, for example, TEOS (tetraethoxysilane), SiC, SiCH, SiCN, SIOC and SIOCH. In this embodiment, the second low dielectric constant insulating film 35 was formed by SiOC so as to have a film thickness of 160 nm.

A wiring trench "A" having a depth of 240 nm was formed to penetrate through the second low dielectric constant insulating film 35 and the first low dielectric constant insulating film 34. Then, a Ti film functioning as a barrier metal 36 and having a thickness of 10 nm and a Cu film 37 having a thickness of 1200 nm were deposited on the second low dielectric constant insulating film 35 having a wiring trench according to the conventional method. A superfluous portion of the Cu film 37 was removed by CMP, thereby exposing the barrier metal 36 as shown in FIG. 6. Then, the composition of slurry was variously altered to polish the Cu film 37 under various conditions. More specifically, using the polishing apparatus shown in FIG. 3, the Cu film 37 was polished while monitoring the table current. During this polishing, the surface temperature of the polishing pad 11 was also measured by a radiation thermometer (not shown).

First of all, the first chemical liquid to be employed as a base slurry was prepared according to the following recipe.
Oxidizing agent: ammonium persulfate (1.5 wt %)
Organic acid: quinaldinic acid (0.3 wt %)
Organic acid: oxalic acid (0.1 wt %)
Abrasive grain: colloidal silica (0.05 wt %)
Surfactant: acetylene glycol (sarfinol 465; Air Products Japan Co., Ltd.) (0.1 wt %)
pH adjustor: potassium hydroxide Further, the following surfactant "A" was dissolved in pure water at a concentration of 0.1 wt % to prepare an aqueous solution of the surfactant "A" for using it separately.

Surfactant "A": DBK (potassium dodecylbenzene sulfonate)

First of all, the polishing of the Cu film 37 was performed by constantly supplying an aqueous solution of the surfactant "A" at a fixed flow rate to the polishing pad together with the first chemical liquid (Polishing No. 1). More specifically, concurrent with the supply of the first chemical liquid to the surface of IC 1000 (Rohm and Haas Co., Ltd.) employed as the polishing pad 11 at a flow rate of 300 cc/min, an aqueous solution of the surfactant "A" was constantly delivered thereto at a flow rate of 30 cc/min and mixed with the first chemical liquid to prepare a slurry at the use point. A top ring 13 holding a semiconductor substrate 12 was contacted with the polishing pad 11 at a polishing load of 300 $gf/cm^2$. With the rotational speed of the turntable 10 being set to 100 rpm and the rotational speed of the top ring 12 being set to 105 rpm, the polishing of the Cu film 37 was performed while monitoring the table current. Upon finishing the removal of a redundant portion of the Cu film 37 existed outside of the wiring trench "A", a 30% over-polishing was further performed.

Then, the polishing rate of Cu film, the table current (polishing friction), and the surface temperature of polishing pad were investigated and assessed according to the following standards.

With respect to the polishing rate of Cu film, a polishing rate of 1000 nm/min or more was marked by "○". With respect to the table current, a table current of 8A or less was marked by "○". With respect to the surface temperature of polishing pad, a surface temperature of 50° C. or less was marked by "○".

Figure 7:
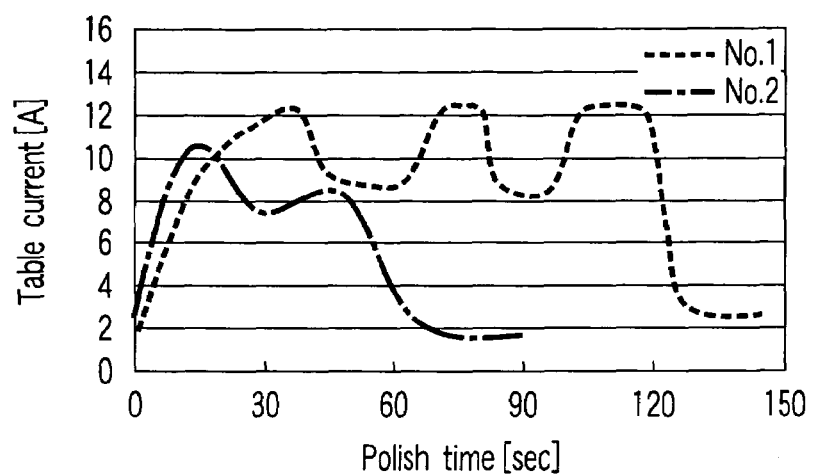
FIG. 7 is a graph illustrating the relationship between the polishing time and the values of table current.

The relationship between the polishing time and the table current is shown in the graph of FIG. 7. In the No. 1 polishing, the table current was increased up to about 12A as shown in the graph of FIG. 7, thereby polishing was suspended. Due to the suspension of the polishing, the table current was lowered to resume the polishing. However, the table current was again increased up to about 12A, thereby polishing is again suspended. Due to repeated suspension of the polishing as described above, it took as long as 145 seconds in accomplishing the polishing.

Concurrent with the supply of the first chemical liquid at a flow rate of 300 cc/min, an aqueous solution of the surfactant "A" employed as the second chemical liquid was delivered thereto at a flow rate of 30 cc/min and mixed with the first chemical liquid to prepare a slurry at the use point. The supply of the second chemical liquid was controlled in conformity with the change of the table current (Polishing No. 2). This Polishing No. 2 is the method according to one embodiment of the present invention. In this Polishing No. 2, the table current was increased exceeding 10A in about 10 seconds from the start of polishing as shown in the graph of FIG. 7. At this moment, the supply of the second chemical liquid was suspended, thus the table current decreased.

When the table current was lowered below 8A, the supply of the second chemical liquid was resumed and continued until the polishing was accomplished. Since the supply of the second chemical liquid was controlled in conformity with the change of the table current, it was possible to perform the polishing taking only as short as 90 seconds.

The assessments on the polishing rate of Cu film, the table current and the surface temperature of polishing pad are summarized in the following Table 1 together with the kinds of surfactants employed and the methods of supplying the liquids. In every case, the dishing after the polishing was confined within not more than 20 nm, i.e., allowable range.

TABLE 1

|  | No. 1 | No. 2 |
| --- | --- | --- |
| Surfactant | A | A |
| Supplying method | Constantly | Under control |
| Polishing rate | X | ○ |
| Table current | X | ○ |
| Pad temp. | X | ○ |

As shown in Table 1 described above, in the case of Polishing No. 1 where the surfactant "A" was constantly supplied, the polishing rate of Cu film, the table current and the surface temperature of polishing pad were all found failing to achieve acceptable levels. Furthermore, in the case of Polishing No. 1, due to the frequent suspension of the polishing, it took a long time in accomplishing desired polishing.

Whereas, in the case of Polishing No. 2, the supply of the aqueous solution of surfactant "A" as the second chemical liquid was controlled in conformity with the change of the table current. Because of this, it was possible to secure an acceptable level in every respects regarding the polishing rate of Cu film, the table current and the surface temperature of polishing pad. In addition to these excellent effects, it was possible, in the case of Polishing No. 2, to reduce the polishing time as compared with the case of Polishing No. 1 as shown in the graph of FIG. 7.

In this embodiment, the second chemical liquid containing a surfactant which raises the table current was employed in performing the polishing of the Cu film, wherein the supply of the second chemical liquid was suspended at the moment when the table current was excessively raised and, at the same time, the supply of the second chemical liquid was regulated depending on the change of the table current, thus accomplishing the polishing of the Cu film. Due to this method, it was confirmed possible to achieve not only a desirable planarity but also a desirable polishing rate without suspending the polishing of the Cu film.

Embodiment 2

As shown in FIG. 5, Cu film 37 having a thickness of 2100 nm was deposited on a Ti film 36 employed as a barrier film in the same manner as described in Embodiment 1 except that the depth of the wiring trench was changed to 1500 nm. Then, a superfluous portion of the Cu film 37 was removed by CMP, thereby exposing the barrier metal 36 as shown in FIG. 6. Then, the composition of slurry was variously altered to polish the Cu film 37 under various conditions. More specifically, using the polishing apparatus shown in FIG. 4, the Cu film 37 was polished while monitoring the surface temperature of the polishing pad. During this polishing, the table current was also measured by using a table current monitor (not shown).

The first chemical liquid constituting a base slurry was prepared according to the same recipe as in the case of Embodiment 1 except that 0.1 wt % potassium dodecylbenzene sulfonate was substituted for the surfactant.

Using only the first chemical liquid thus prepared as a slurry, the Cu film 37 was polished under the same conditions as in the case of Embodiment 1 while monitoring the surface temperature of the polishing pad (Polishing No. 3). Then, the polishing rate of Cu film, the table current (polishing friction), and the surface temperature of polishing pad were investigated and assessed according to the same standards as described above.

Figure 8:
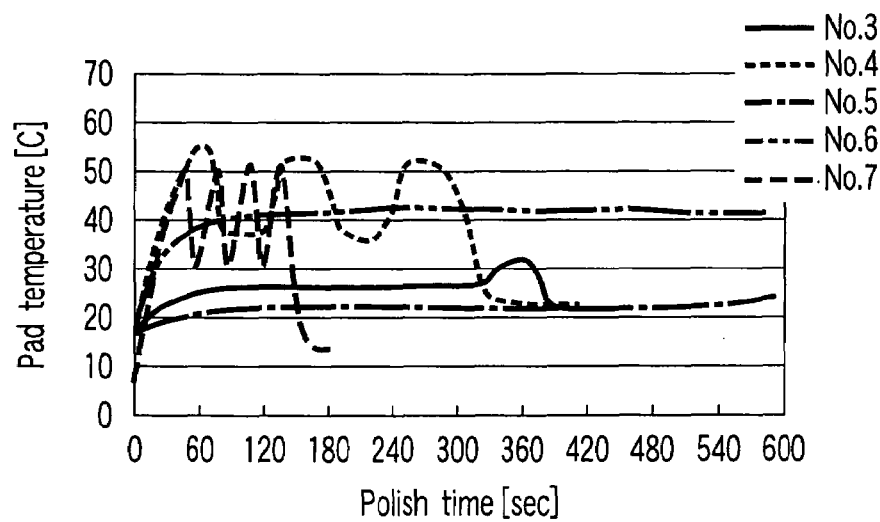
FIG. 8 is a graph illustrating the relationship between the polishing time and the surface temperature of polishing pad.

The relationship between the polishing time and the surface temperature of the polishing pad is shown in the graph of FIG. 8. As shown in FIG. 8, in the case of the polishing of No. 3, since the surface temperature of the polishing pad was suppressed to not higher than 30° C. or so, it took 430 seconds in accomplishing the polishing intended.

Then, the polishing of the Cu film 37 was performed using also a surfactant and assessed in the same manner as described above. As for the surfactant, the following two surfactants were prepared.

Surfactant B: sarfinol 465

Surfactant C: poly(vinyl pyrrolidone) (PVP-K30)

As already explained above, the surfactant B (sarfinol 465) raises the surface temperature of the polishing pad, and the surfactant C (PVP-K30) lowers the surface temperature of the polishing pad.

The surfactants B and C were respectively dissolved in pure water at a concentration of 0.1 wt %, thus preparing an aqueous solution of the surfactant B and an aqueous solution of the surfactant C, respectively.

The polishing of the Cu film was performed under the same conditions as described above except that the following slurry was employed (Polishing No. 4). The slurry was prepared at the use point by supplying the first chemical liquid and the aqueous solution of the surfactant B constantly to the polishing pad at a fixed flow rate and mixed together. The flow rate of the first chemical liquid was set to 300 cc/min, and the flow rate of the surfactant B was set to 30 cc/min. In the polishing of No. 4, the surface temperature of the polishing pad increased up to about 55° C. and then the polishing was suspended as shown in the graph of FIG. 8. Subsequently, as the surface temperature of the polishing pad was lowered, the polishing was resumed. However, the surface temperature of the polishing pad was again increased up to about 54° C. and then the polishing was suspended. Due to repeated suspension of the polishing as described above, it took as long as 420 seconds in accomplishing the polishing.

The polishing of the Cu film was performed under the same conditions as in the case of the aforementioned No. 4 except that the surfactant C was substituted for the surfactant B and that the aqueous solution of the surfactant C was constantly supplied to the polishing pad together with the first chemical liquid (Polishing No. 5). In the polishing of No. 5, the surface temperature of the polishing pad was not raised and maintained at about 20° C. as shown in the graph of FIG. 8. Because of this, it was impossible to satisfactorily abrade the Cu film within a time period of 600 seconds.

The polishing of the Cu film was performed under the same conditions as in the case of the Polishing No. 4 except that an aqueous solution of the surfactant C was additionally employed. The flow rate of the aqueous solution of the surfactant C was set to 30 cc/min and fed constantly to the polishing pad together with the first chemical liquid and the aqueous solution of the surfactant B (Polishing No. 6).

While the surfactant B raises the surface temperature of the polishing pad, the surfactant C lowers the surface temperature of the polishing pad. Due to the effect of the surfactant B, the surface temperature of the polishing pad was raised up to about 40° C. However, due to the effect of the surfactant C which was constantly and currently supplied, the polishing property degraded. As a result, in the polishing of No. 6, it was impossible to satisfactorily abrade the Cu film within a time period of 600 seconds.

Using the aqueous solution of the surfactant B as the second chemical solution and also the aqueous solution of the surfactant C as the third chemical solution, the polishing of the Cu film was performed as follows. First of all, the first chemical liquid was supplied at a flow rate of 300 cc/min and also the second chemical liquid was supplied at a flow rate of 30 cc/min, thereby mixing these chemical liquids with each other at the use point to prepare a slurry. Using this slurry, the polishing of the Cu film was started. The supply of the second chemical liquid was controlled in conformity with the change of the surface temperature of the polishing pad (Polishing No. 7). This Polishing No. 7 belongs to the method according to one embodiment of the present invention. In this polishing of No. 7, the surface temperature of the polishing pad exceeded 50° C. in about 50 seconds from the start of polishing as shown in the graph of FIG. 8. At this moment, the supply of the second chemical liquid was suspended and, at the same time, the third chemical liquid was supplied at a flow rate of 30 cc/min, thereby lowering the temperature of the polishing pad. When the surface temperature of the polishing pad was decreased lower than 30° C., the supply of the third chemical liquid was suspended and, at the same time, the supply of the second chemical liquid was resumed. Switching in supply of the second chemical liquid and the third chemical liquid was executed in conformity with the change of the surface temperature of the polishing pad. Finally, the supply of the second chemical liquid was continued to accomplish the polishing of the Cu film. As a result, it was possible to perform the polishing of the Cu film taking only 180 seconds.

The assessments on the polishing rate of Cu film, the table current and the surface temperature of polishing pad are summarized in the following Table 2 together with the kinds of surfactants employed and the methods of supplying the liquids. In every case, the dishing after the polishing was confined within not more than 20 nm, i.e., allowable range.

TABLE 2

|  | No. 3 | No. 4 | No. 5 | No. 6 | No. 7 |
|---|---|---|---|---|---|
| Surfactant | — | B | C | B, C | B, C |
| Supplying method | — | Constantly | | | Under control |
| Polishing rate | X | X | X | X | ○ |
| Table current | ○ | X | X | ○ | ○ |
| Pad temp. | ○ | X | X | ○ | ○ |

In the case of the Polishing No. 3 where the polishing was performed without using any kind of surfactant, it was impossible to sufficiently increase the surface temperature of the polishing pad, thus making it poor in polishing rate. In the case of the Polishing No. 4 where the aqueous solution of the surfactant "B" was constantly supplied, the surface temperature of the polishing pad became too high, the polishing was suspended. In the case of the Polishing No. 5 where the aqueous solution of the surfactant "C" was constantly supplied, the surface temperature of the polishing pad was suppressed to around 20° C., thus further decreasing the polishing rate.

In the case of the Polishing No. 6 where not only the aqueous solution of the surfactant "B" but also the aqueous solution of the surfactant "C" was constantly supplied, although it was possible to raise the table current and the surface temperature of the polishing pad, it was impossible to increase the polishing rate. The reason for this was considered as to be that since two kinds of surfactants, each exhibiting a conflicting effect with each other, were mixed with each other, the polishing properties of the slurry degraded.

In the case of the Polishing No. 7, the second chemical liquid which raises the surface temperature of the polishing pad as well as the third chemical liquid which lowers the surface temperature of the polishing pad was employed in such a manner that the supply of these chemical liquids was switched to each other in conformity with the change of the surface temperature of the polishing pad. Owing to this switching, it was possible to enhance the temperature controllability and to realize excellent finishing of polishing within a short polishing time. Moreover, it was possible to raise the table current and the surface temperature of the polishing pad without expanding the dishing.

In this embodiment, the depth of the trench formed in the insulating film was as deep as 1500 nm and the Cu film was deposited thereon at a film thickness of as large as 2100 nm. In this case, the surface temperature of the polishing pad at the initial stage of polishing is as low as 20° C. to 30° C. and hence the polishing rate would be very slow. Because of this, according to the conventional polishing method, it would take 430 seconds for removing the Cu film to a desired extent. When the depth of the trench is large, the surface temperature of the polishing pad cannot be easily increased. This tendency is also applicable to the changing of table current.

It has been found out by the present inventors that the surface temperature of the polishing pad should most preferably be confined within the range of 30° C. to 50° C. and that as long as the surface temperature of the polishing pad is maintained within this range, it is possible to promote the polishing rate. Therefore, according to this embodiment, the surface temperature of the polishing pad during the polishing step was measured by using a radiation thermometer, and the supply of chemical liquid was controlled in conformity with the change of the temperature. More specifically, when the surface temperature of the polishing pad goes below 30° C., the second chemical liquid which raises the temperature thereof is supplied to the polishing pad to reverse the temperature thereof to an appropriate range. Namely, as the second chemical liquid is supplied, the surface temperature of the polishing pad will be raised subsequently. On the other hand, when the surface temperature of the polishing pad is raised up over 50° C., the supply of the second chemical liquid is suspended and, at the same time, the third chemical liquid which lowers the temperature is supplied to the polishing pad, thereby the change of the temperature thereof is reversed. By doing so, the Cu film having a thickness of 2100 nm and deposited on the insulating film provided with a trench having a depth of 1500 nm can be suitably removed within 180 seconds. Such a rapid polishing has been realized for the first time by using this embodiment.

Incidentally, when the polishing of the Cu film was performed in the same manner as in. the case of the Polishing No. 7 except that the third chemical liquid was not employed, it was possible to obtain almost the same effects as those obtained in the Polishing No. 7 except that the polishing time was slightly prolonged. More specifically, it was possible to perform the polishing with the table current and the surface temperature of the polishing pad being kept higher and without expanding the dishing. Although the polishing time was increased to 240 seconds in this case, it was possible to enhance the polishing rate of the Cu film as compared with the Polishing No. 3 where the polishing was performed without using the second chemical liquid. In this manner, due to the supply of the second chemical liquid containing sarfinol 465 while controlling the supply thereof, it was confirmed possible to secure the planarity desired of polished surface without suspending the polishing. As described above, due to the co-use of the third chemical liquid, it was possible to further reduce the polishing time.

Embodiment 3

The polishing of the Cu film 37 was performed in the same manner as in the case of the aforementioned Embodiment 1 except that the composition of the first chemical liquid and the surfactant to be included in the second chemical liquid were changed. The first chemical liquid used as a base slurry was prepared according to the same recipe as that of Embodiment 1 except that 0.1 wt % potassium dodecylbenzene sulfonate (DBK) was additionally added as a surfactant.

Using only the first chemical liquid thus prepared as a slurry, the Cu film 37 was polished under the same conditions as in the case of Embodiment 1 while monitoring the table current (Polishing No. 8). Then, the polishing rate of Cu film, the table current (polishing friction), and the surface temperature of polishing pad were investigated and assessed according to the same standards as described above.

Figure 9:
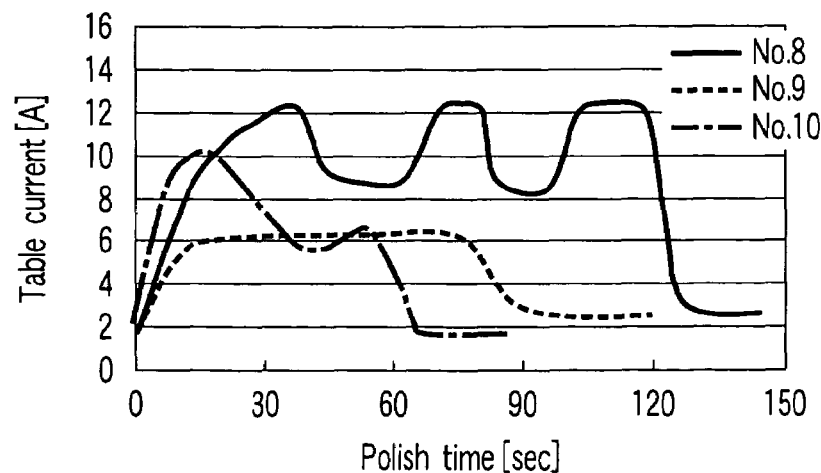
FIG. 9 is a graph illustrating the relationship between the polishing time and the values of table current.

The relationship between the polishing time and the table current is shown in the graph of FIG. 9. Since the slurry employed in the Polishing No. 8 contained DBK and sarfinol, the composition of the slurry was the same as that employed in the Polishing No. 1 explained in Embodiment 1. Because of this, the table current changed in the same manner as in the case of the Polishing No. 1 and hence the suspension of polishing was repeated, thus taking a polishing time of as long as 140 seconds to finish the polishing as shown in the graph of FIG. 9. Since the depth of the trench was as shallow as 240 nm in this Embodiment 3, the table current was more likely to increase. Moreover, the surfactant included in the slurry employed in the Polishing No. 8 was effective in increasing the table current. The change of the table current shown in FIG. 9 was considered to originate from the inclusion of this surfactant.

Then, the polishing of the Cu film 37 was performed by separately using a surfactant and the result of polishing was assessed in the same manner as described above. As the surfactant separately employed herein, the aforementioned surfactant C (PVP-K30) was employed.

The polishing of the Cu film was performed under the same conditions as described above except that the following slurry was employed (Polishing No. 9). The slurry was prepared at the use point by supplying the first chemical liquid and the aqueous solution of the surfactant C constantly to the polishing pad at a fixed flow rate and mixed together. The flow rate of the first chemical liquid was set to 300 cc/min, and the flow rate of the surfactant C was set to 30 cc/min. The slurry employed herein was of the same composition as the slurry employed in the Polishing No. 6 of Embodiment 2. Since a surfactant (PVP-K30) which lowers the table current was incorporated concurrent with a surfactant (sarfinol 465, DBK) which increases the table current in the slurry, the rise of the table current was suppressed.

As explained in the aforementioned Embodiment 2, as the trench becomes deeper, it is more difficult to raise the table current. The polishing rate is dependent on the composition of the slurry and on the magnitude of table current, but the dependency of this polishing rate becomes more prominent as the depth of the trench becomes shallower. Therefore, when the trench is as shallow as 240 nm, the table current tends to increase more easily, so that in the case of the Polishing No. 8, it took as long as 140 seconds in accomplishing the polishing. In the case of the Polishing No. 9, since the surfactant C was constantly supplied, due to this surfactant C, the rise of the table current was suppressed. Rather, the table current was maintained at a low level. As a result, although the polishing time was shortened as compared with the Polishing No. 8, it failed to attain the acceptable level.

Using the aqueous solution of the surfactant C as the second chemical liquid, the polishing of the Cu film was performed as follows. First of all, the first chemical liquid was supplied at a flow rate of 300 cc/min to initiate the polishing the Cu film 37. The supply of the second chemical liquid was controlled in conformity with the change of the table current (Polishing No. 10). This Polishing No. 10 was equivalent to the method according to one embodiment of the present invention. In this Polishing No. 10, the table current was increased exceeding 10 A in about 10 seconds from the start of polishing as shown in the graph of FIG. 9. At this moment, the second chemical liquid was supplied at a flow rate of 30 cc/min and mixed with the first chemical liquid to prepare a slurry at the use point. Using this slurry, the polishing was continued, thus the table current decreased. When the table current was lowered below 6 A, the supply of the second chemical liquid was suspended, the table current increased. Since the supply of the second chemical liquid was controlled in conformity with the change of the table current, it was possible to perform the polishing taking only about 90 seconds.

The assessments on the polishing rate of Cu film, the table current and the surface temperature of polishing pad are summarized in the following Table 1 together with the kinds of surfactants employed and the methods of supplying the liquids. In every case, the dishing after the polishing was confined within not more than 20 nm, i.e., an allowable range.

TABLE 3

|  | No. 8 | No. 9 | No. 10 |
| --- | --- | --- | --- |
| Surfactant | — | C | C |
| Supplying method | — | Constantly | Under control |
| Polishing rate | X | X | ○ |
| Table current | X | X | ○ |
| Pad temp. | X | X | ○ |

In the case of the Polishing No. 8 where the polishing was performed without using any kind of surfactant, since the table current indicated a tendency to rise, not only the polishing rate of Cu film but also the polishing temperature became high, thus all failing to achieve acceptable levels. In the case of Polishing No. 9 where the aqueous solution of the surfactant C was constantly supplied also, it was impossible to keep the table current and the temperature of the polishing pad within an optimal range, thus failing to achieve an acceptable level in the polishing rate.

In the case of the Polishing No. 10, since the supply of the second chemical liquid was controlled in conformity with the change of the table current, it was possible to secure an acceptable level in all of the polishing rate, the table current and the polishing temperature. Moreover, in the case of the Polishing No. 10, it was possible to perform the polishing taking only about 90 seconds, as shown in the graph of FIG. 9.

In this embodiment, the second chemical liquid containing a surfactant which lowers the table current was employed, supplying it as the table current was undesirably increased. Namely, the Cu film was polished while supplying this second chemical liquid under control in conformity with the change of the table current. It was confirmed that when the polishing of the Cu film was performed by using this method, it was possible to achieve not only a desirable planarity but also desirable polishing rate without suspending the polishing of the Cu film.

According to embodiments of the present invention, it is possible to provide a method of polishing a Cu film at a low friction and with excellent stability and also to provide a method for manufacturing a semiconductor device provided with a Cu wiring and exhibiting excellent reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for polishing a Cu film comprising:
    contacting a Cu film formed above a semiconductor substrate with a polishing pad attached to a turntable; and
    supplying a first chemical liquid which promotes the polishing of the Cu film and a second chemical liquid which contains a surfactant, to the polishing pad while the turntable being rotated, thereby polishing the Cu film, while monitoring at least one of a table current of the turntable and a surface temperature of the polishing pad to detect a change in at least one of the table current of the turntable and the surface temperature of the polishing pad, the supply of the second chemical liquid being controlled in conformity with the change, thereby reversing the change.

2. The method according to claim 1, wherein the second chemical liquid is supplied at a flow rate of 100 cc/min or less.

3. The method according to claim 1, wherein the second chemical liquid is supplied by spray.

4. The method according to claim 1, wherein the second chemical liquid contains the surfactant at a concentration ranging from 0.1 to 2 wt %.

5. The method according to claim 1, wherein the first chemical liquid comprises water, an oxidizing agent and an organic acid.

6. The method according to claim 5, wherein the first chemical liquid further comprises abrasive grains.

7. The method according to claim 1, wherein the first chemical liquid is supplied to the polishing pad before supplying the second chemical liquid, and the change is reversed by supplying the second chemical liquid.

8. The method according to claim 7, further comprising supplying a third chemical liquid containing a surfactant, together with supplying the first chemical liquid, to the polishing pad before supplying the second chemical liquid, the supply of the third chemical liquid being controlled in association with the supply of the second chemical liquid, thereby changing a supply flow rate of the third chemical liquid and the supply flow rate of the second chemical liquid at the same time, the change of the supply flow rate of the third chemical liquid being reverse to that of the second chemical liquid.

9. The method according to claim 7, wherein the at least one of the table current and the surface temperature increases before supplying the second chemical liquid, and the at least one of the table current and the surface temperature decreases by supplying the second chemical liquid to the polishing pad, and further comprising suspending the supply of the second chemical liquid to increase the at least one of the table current and the surface temperature.

10. The method according to claim 7, wherein the supply flow rate of the second chemical liquid is negatively correlated with the change.

11. The method according to claim 10, wherein the surfactant contained in the second chemical liquid is poly (vinyl pyrrolidone).

12. The method according to claim 1, wherein the first chemical liquid is supplied to the polishing pad concurrent with the supply of the second chemical liquid, and the change is reversed by suspending the supply of the second chemical liquid.

13. The method according to claim 12, wherein the at least one of the table current and the surface temperature increases before suspending the supply of the second chemical liquid, and the at least one of the table current and the surface temperature decreases by suspending the second chemical liquid, and further comprising supplying the second chemical liquid to increase the at least one of the table current and the surface temperature.

14. The method according to claim 12, wherein the supply flow rate of the second chemical liquid is positively correlated with the change.

15. The method according to claim 14, wherein the surfactant contained in the second chemical liquid is selected from the group consisting of alkylbenzene sulfonate and acetylene glycol.

16. A method for manufacturing a semiconductor device, comprising:
    forming an insulating film above a semiconductor substrate;
    forming a recess in the insulating film;
    forming a Cu film, through a barrier metal, in the recess and above the insulating film; and
    removing the Cu film above the insulating film to selectively leave the Cu film in the recess, thereby forming a buried wiring; the removal of the Cu film formed above the insulating film being performed by contacting the Cu film with a polishing pad attached to a turntable; supplying a first chemical liquid which promotes the polishing of the Cu film and a second chemical liquid which contains a surfactant, to the polishing pad while the turntable being rotated, thereby polishing the Cu film, while monitoring at least one of a table current of the turntable and a surface temperature of the polishing pad to detect a change in at least one of the table current of the turntable and the surface temperature of the polishing pad, the supply of the second chemical liquid being controlled in conformity with the change, thereby reversing the change.

17. The method according to claim 16, wherein the first chemical liquid is supplied to the polishing pad before supplying the second chemical liquid, and the change is reversed by supplying the second chemical liquid.

18. The method according to claim 17, wherein the supply flow rate of the second chemical liquid is negatively correlated with the change.

19. The method according to claim 16, wherein the first chemical liquid is supplied to the polishing pad concurrent with the supply of the second chemical liquid, and the change is reversed by suspending the supply of the second chemical liquid.

20. The method according to claim 19, wherein the supply flow rate of the second chemical liquid is positively correlated with the change.

* * * * *